United States Patent
Park et al.

(10) Patent No.: US 9,549,458 B2
(45) Date of Patent: Jan. 17, 2017

(54) RADIANT HEAT CIRCUIT BOARD, HEAT GENERATING DEVICE PACKAGE HAVING THE SAME, AND BACKLIGHT UNIT

(75) Inventors: Hyun Gyu Park, Seoul (KR); Eun Jin Kim, Seoul (KR); Hae Yeon Kim, Seoul (KR); Jae Man Park, Seoul (KR); Yun Ho An, Seoul (KR); Hyuk Soo Lee, Seoul (KR); In Hee Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 750 days.

(21) Appl. No.: 13/878,319

(22) PCT Filed: Oct. 5, 2011

(86) PCT No.: PCT/KR2011/007337
§ 371 (c)(1),
(2), (4) Date: Apr. 12, 2013

(87) PCT Pub. No.: WO2012/047002
PCT Pub. Date: Apr. 12, 2012

(65) Prior Publication Data
US 2013/0206459 A1 Aug. 15, 2013

(30) Foreign Application Priority Data
Oct. 6, 2010 (KR) .................. 10-2010-0097474

(51) Int. Cl.
*H05K 1/02* (2006.01)
*H01L 25/075* (2006.01)
(Continued)

(52) U.S. Cl.
CPC ........... *H05K 1/021* (2013.01); *H01L 25/0753* (2013.01); *H05K 1/056* (2013.01);
(Continued)

(58) Field of Classification Search
USPC .................. 174/252; 362/97.1; 361/715, 720
See application file for complete search history.

(56) References Cited

U.S. PATENT DOCUMENTS 7,355,276 B1 * 4/2008 Lanciault ................ H01L 24/32
257/706
2002/0175621 A1 11/2002 Song et al.
(Continued)

FOREIGN PATENT DOCUMENTS

DE 10-2004-031685 A1 1/2006
DE 102004031685 A1 * 1/2006 ............... F21K 9/00
(Continued)

OTHER PUBLICATIONS

Supplementary European Search Report dated Feb. 25, 2014 in European Application No. 11830887.3.
(Continued)

*Primary Examiner* — William H Mayo, III
*Assistant Examiner* — Krystal Robinson
(74) *Attorney, Agent, or Firm* — Saliwanchik, Lloyd & Eisenschenk

(57) ABSTRACT

Provided is a radiant heat circuit board for mounting a plurality of heat generating devices. The radiant heat circuit board includes a metal plate including an integrated metal projection to which the plurality of heat generating devices are attached, an insulation layer exposing the integrated metal projection, the insulation layer being disposed on the metal plate, and a plurality of electrode pads disposed on the insulation layer, the plurality of electrode pads applying a voltage into each of the heat generating devices. Thus, a radiant projection may be disposed between the heat generating devices to improve heat radiation.

15 Claims, 4 Drawing Sheets

(51) Int. Cl.
  *H05K 1/05* (2006.01)
  *H01L 23/367* (2006.01)
  *H01L 23/498* (2006.01)
  *H01L 33/64* (2010.01)

(52) U.S. Cl.
  CPC .... *H01L 23/3677* (2013.01); *H01L 23/49838* (2013.01); *H01L 33/642* (2013.01); *H01L 2224/73203* (2013.01); *H05K 1/0204* (2013.01); *H05K 2201/09054* (2013.01); *H05K 2201/10106* (2013.01)

(56) References Cited

U.S. PATENT DOCUMENTS

| | | | | |
|---|---|---|---|---|
| 2003/0025850 | A1* | 2/2003 | Nitto | G02B 6/0088 349/58 |
| 2004/0065894 | A1 | 4/2004 | Hashimoto et al. | |
| 2004/0173901 | A1* | 9/2004 | Mallik | H01L 23/13 257/738 |
| 2006/0197101 | A1 | 9/2006 | Wu | |
| 2007/0007540 | A1* | 1/2007 | Hashimoto | H01L 33/642 257/94 |
| 2007/0081342 | A1* | 4/2007 | Szeto | F21K 9/00 362/294 |
| 2007/0164291 | A1* | 7/2007 | Kim | H05K 1/0204 257/79 |
| 2008/0149373 | A1* | 6/2008 | Kim | H01L 33/483 174/255 |
| 2008/0278917 | A1* | 11/2008 | Lin | H01L 33/642 361/715 |
| 2009/0116252 | A1* | 5/2009 | Kille | H05K 1/0204 362/373 |
| 2009/0168403 | A1* | 7/2009 | Chang | F21K 9/00 362/97.1 |
| 2009/0196017 | A1* | 8/2009 | Wang | G02F 1/133615 362/97.1 |
| 2010/0032705 | A1 | 2/2010 | Shin et al. | |

FOREIGN PATENT DOCUMENTS

| | | |
|---|---|---|
| JP | 2006100687 A | 4/2006 |
| KR | 20080053048 A | 6/2008 |
| KR | 10-2009-0088633 A | 8/2009 |
| KR | 20100057321 A | 5/2010 |
| TW | M311844 U | 5/2007 |

OTHER PUBLICATIONS

International Search Report in International Application No. PCT/KR2011/007337, filed Oct. 5, 2011.

Office Action dated May 29, 2013 in Taiwanese Application No. 100135526, filed Sep. 30, 2011.

Korean Office Action filed on Dec. 1, 2016 in Korean Application No. 1020100097474.

\* cited by examiner

US 9,549,458 B2

RADIANT HEAT CIRCUIT BOARD, HEAT GENERATING DEVICE PACKAGE HAVING THE SAME, AND BACKLIGHT UNIT

CROSS-REFERENCE TO RELATED APPLICATIONS

This application is the U.S. national stage application of International Patent Application No. PCT/KR2011/007337, filed Oct. 5, 2011, which claims priority to Korean Application No. 10-2010-0097474, filed Oct. 6, 2010, the disclosures of each of which are incorporated herein by reference in their entirety.

TECHNICAL FIELD

The present disclosure relates to a radiant heat circuit board.

BACKGROUND ART

A circuit board includes a circuit pattern on an insulation board. The circuit board is a board for mounting electric components.

Such an electric component may include a heat generating device, e.g., a light emitting diode (LED). The heat generating device may emit serious heat. Heat emitted from the heat generating device may increase a temperature of the circuit board to cause malfunction of the heat generating device and deteriorate reliability of the heat generating device.

To solve the limitation due to the radiant heat, a radiant heat circuit board of FIG. 1 has been proposed.

FIG. 1 is a sectional view of a radiant heat circuit board according to a related art.

Referring to FIG. 1, a radiant heat circuit board according to a related art includes a metal plate 1 including a radiant heat projection 2, an insulation layer 3, a circuit pattern 4, and a solder resist 5.

In the radiant heat circuit board 10, a heat generating device 20 is attached to the radiant heat projection 2 to transfer heat into the lower metal plate 1. Here, the heat generating device is connected to the circuit pattern 4 through a solder 6.

In the radiant heat circuit board 10 according to the related art, heat emitted from the mounted heat generating device 20 is not transferred into the metal plate 2 for releasing heat due to interference of the insulation layer 3.

DISCLOSURE OF INVENTION

Technical Problem

Embodiments provide a radiant heat circuit board having a new structure.

Embodiments also provide a radiant heat circuit board having improved thermal efficiency.

Solution to Problem

In one embodiment, a radiant heat circuit board for mounting a plurality of heat generating devices includes: a metal plate including an integrated metal projection to which the plurality of heat generating devices are attached; an insulation layer exposing the integrated metal projection, the insulation layer being disposed on the metal plate; and a plurality of electrode pads disposed on the insulation layer, the plurality of electrode pads applying a voltage into each of the heat generating devices.

In another embodiment, a heat generating device package includes: a radiant heat circuit board including an integrated pad in which a plurality device mounting areas are defined, the integrated pad crossing the plurality of device mounting areas and being connected to each other; and a plurality of heat generating devices attached to the integrated pad which is exposed to each of device mounting areas.

The details of one or more embodiments are set forth in the accompanying drawings and the description below. Other features will be apparent from the description and drawings, and from the claims.

Advantageous Effects of Invention

According to the embodiments, the metal plate including the radiant heat projection may be disposed under the mounting pad to directly transfer heat emitted from the heat generating devices into the metal plate, thereby improving the thermal efficiency. Also, the radiant heat projection may be integrated to perform heat transfer between the heat generating devices, thereby improving the heat radiation.

MODE FOR THE INVENTION

Figure 1:
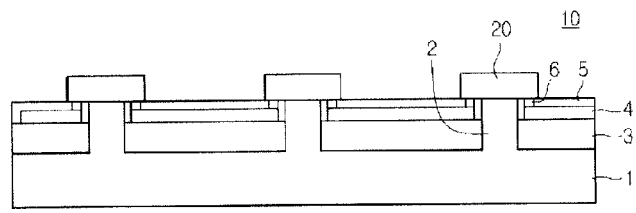
FIG. 1 is a sectional view of a radiant heat circuit board according to a related art.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In this specification, when it is described that one comprises (or includes or has) some elements, it should be understood that it may comprise (or include or has) only those elements, or it may comprise (or include or have) other elements as well as those elements if there is no specific limitation.

In the drawings, anything unnecessary for describing the present disclosure will be omitted for clarity, and thicknesses are enlarged for the purpose of clearly illustrating layers and areas. Like reference numerals in the drawings denote like elements, and thus their descriptions will be omitted.

In the specification, it will be understood that when a layer, a film, a region, or a plate is referred to as being 'on' another layer, film, region, or plate, it can be directly on the other layer, region, or plate, or intervening layers, films, regions, or plates may also be present. On the other hand, it will also be understood that when a layer, a film, an area or a plate is referred to as being "directly on" another one, intervening layers, films, areas, and plates may not be present.

The present disclosure provides a circuit board in which a pad projection for mounting a plurality of heat generating devices on a metal plate are integrated to improve heat radiation.

Hereinafter, a radiant heat circuit board according to a first embodiment and a heat generating device package having the same will be described with reference to FIGS. 2 to 5.

Figure 2:
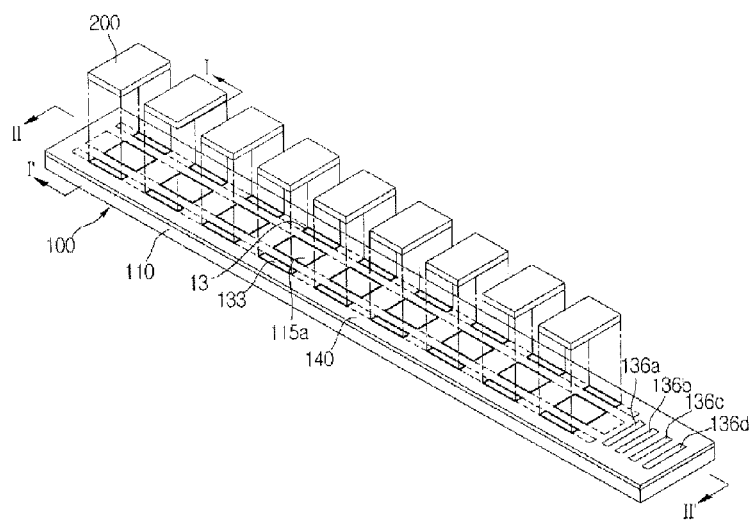
FIG. 2 is an exploded perspective view of a heat generating device package according to a first embodiment.
Figure 3:
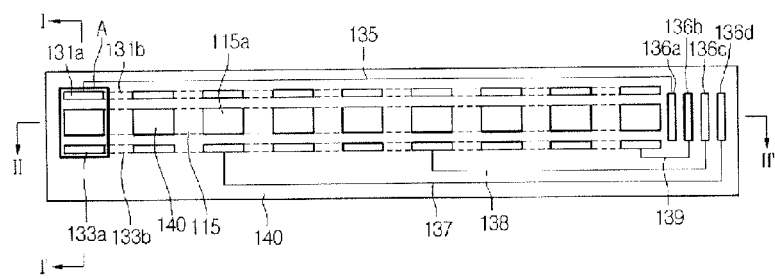
FIG. 3 is a top view illustrating a radiant heat circuit board of FIG. 2.
Figure 4:
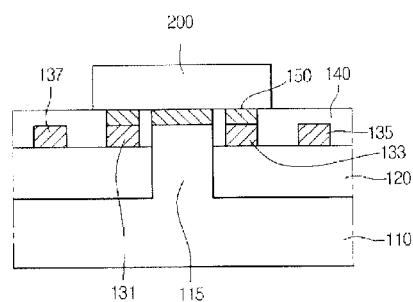
FIG. 4 is a sectional view taken along line I-I' of the heat generating device package of FIG. 2.
Figure 5:
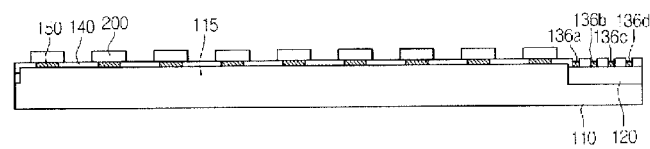
FIG. 5 is a sectional view taken along line II-II' of the heat generating device package of FIG. 2.

FIG. 2 is an exploded perspective view of a heat generating device package according to a first embodiment. FIG. 3 is a top view illustrating a radiant heat circuit board of FIG. 2. FIG. 4 is a sectional view taken along line I-I' of the heat generating device package of FIG. 2. FIG. 5 is a sectional view taken along line II-II' of the heat generating device package of FIG. 2.

Hereinafter, a heat generating device package will be described together with a radiant heat circuit board having the same.

Referring to FIGS. 2 to 5, a heat generating device package according to the first embodiment includes a radiant heat circuit board 100 and a plurality of heat generating devices 200 mounted on the radiant heat circuit board 100.

The radiant heat circuit board 100 includes mounting pads 115a arrayed in a line to mount the plurality of heat generating devices 200 arrayed in a line.

Although the bar-type radiant heat circuit board 100 is illustrated in the current embodiment, the present disclosure is not limited thereto. When the plurality of heat generating devices 200 arrayed in a line are mounted on the radiant heat circuit board 100, the radiant heat circuit board 100 may include the plurality of mounting pads 115a arrayed in a line.

The radiant heat circuit board 100 includes a metal plate 110, insulation layers 120 and 140 disposed on the metal plate 110, and circuit patterns 131, 133, 135, 137, 138, 139, 136a, 136b, 136c, and 136d disposed on the insulation layers 120 and 140.

The metal plate 110 may be formed of one of one of alloys containing copper, aluminum, nickel, gold, or platinum which has superior thermal conductivity.

The metal plate 110 includes a metal projection 115 constituting the mounting pad 115a for mounting the heat generating device 200.

The metal projection 115 extends from the metal plate 10 to vertically protrude. A portion of a top surface of the metal projection 115 may serve as the mounting pad 115a for mounting the heat generating device 200. Also, the metal projection 115 has a predetermined width so that a solder 150 is disposed on the top surface thereof.

The metal projection 115 may be integrally provided to simultaneously mount the plurality of heat generating devices 200 arrayed in one line.

That is, the metal projection 115 disposed under the heat generating device 200 and the metal projection 115 disposed under the adjacent heat generating device 200 are connected to each other. Thus, the metal projection 115 extends between the heat generating device 200 and the adjacent heat generating device 200.

The metal plate 110 may be etched or a plating or printing process may be performed on the metal plate 110 to manufacture the integrated metal projection 115.

As described above, since the metal projection 115 is integrally provided under the plurality of heat generating devices 200 arrayed in one line, the metal layer is disposed into an area between the heat generating devices 200 which is filled with an insulation layer 120 in a related art, thereby improving heat radiation.

The integrated metal projection 115 may be opened to form a first insulation layer 120.

The first insulation layer 120 may include a plurality of insulation layers. Also, the first insulation layer 120 insulates the metal plate 110 from the circuit patterns 131, 133, 135, 137, 138, 139, 136a, 136b, 136c, and 136d disposed thereon.

The first insulation layer 120 is formed of an epoxy-based insulation resin having low conductivity (about 0.2 W/mk to about 0.4 W/mk). On the other hand, the first insulation layer 120 may be formed of a polyimide-based resin having relatively high conductivity.

A prepreg formed by impregnating the resin into a solid component 21 such as a reinforced fiber, a glass fiber, or a filler may be cured to form the first insulation layer 120.

The first insulation layer 120 may expose the metal projection 115. Also, the first insulation layer 120 may have a thickness less than a height of the metal projection 115.

A plurality of circuit patterns 131, 133, 135, 137, 138, 139, 136a, 136b, 136c, and 136d are disposed on the second insulation layer 140.

The circuit patterns 131, 133, 135, 137, 138, 139, 136a, 136b, 136c, and 136d include a plurality of power pads 136a, 136b, 136c, and 136d, a plurality of electrode wires 131 and 133, and a plurality of circuit wires 135, 137, 138, and 139 connecting the power pads 136a, 136b, 136c, and 136d to the electrode pads 131 and 133.

The power pads 136a, 136b, 136c, and 136d are disposed on an edge area of the circuit board 100. The power pads 136a, 136b, 136c, and 136d receive a voltage from the outside to provide the voltage into the electrode lines 131 and 133 through the circuit wires 135, 137, 138, and 139.

The power pads 136a, 136b, 136c, and 136d are exposed by a second insulation layer 140 burying the circuit wire 135, 137, 138, and 139. The power pads 136a, 136b, 136c, and 136d include a first power pad 136a for receiving a positive voltage from the outside and second to fourth power pads 136b, 136c, and 136d for receiving a negative voltage.

Although three pads 136b, 136c, and 136d for receiving the negative voltage are provided in the current embodiment, the present invention is not limited thereto. For example, the number of power pads may be variously changed according to the number of heat generating devices 200 and a circuit design.

The electrode lines 131 and 133 may extend in a line direction along the integrated metal projection 115 to cross a mounting area A of the plurality of heat generating devices 200.

The electrode wires 131 and 133 includes a first electrode wire 131 and a second electrode wire 133 which face each other with the integrated metal projection 115 therebetween.

The first and second electrode wires 131 and 133 include a first electrode pad 131a and a second electrode pad 133a which face each other with the mounting pad 155*a* exposed to the mounting area A of the heat generating device 200 therebetween.

Also, the first electrode wire 131 includes a connection part 131*b* buried by a second insulation layer 140 between the adjacent first electrode pads 131*a*, and the second electrode wire 133 includes a connection part 133*b* buried by a second insulation layer 140 between the adjacent second electrode pads 133*a*.

Thus, as shown in FIGS. 2 and 3, the second insulation layer 140 exposes the power pads 136*a*, 136*b*, 136*c*, and 156*d* and buries the circuit wires 135, 137, 138, and 139. Also, in each of the heat generating device mounting areas A, the second insulation layer 140 exposes the mounting pas 115*a* that is a top surface of the metal projection 115 and the first and second electrode wires 131 and 133 to define the first and second electrode pads 131*a* and 133*a*.

The circuit wires 135, 137, 138, and 139 include a positive circuit wire 135 connecting the first power pad 136*a* to the first electrode wire 131 and a plurality of negative circuit wires 137, 138, and 139 connecting the second to fourth power pads 136*b*, 136*c*, and 136*d* to the second electrode wire 133.

The number of negative circuit wires 137, 138, and 139 may be equal to that of the power pads 136*b*, 136*c*, and 136*d* receiving the negative voltage. Also, the plurality of negative circuit wires 137, 138, and 139 are connected to a portion of the second electrode pad 133*a* of the plurality of electrode pads 133*a* of the second electrode wire 133 to transfer a negative voltage.

Here, in each of the exposed pads 115*a*, 131*a*, 133*a*, 136*a*, 136*b*, 136*c*, and 136*d*, a metal for forming the circuit patterns may be surface-treated. For the surface treatment, a plating process may be performed using silver, nickel, or gold to easily realize wire bonding or solder bonding.

The second insulation layer 140 may be formed of a solder resist to protect the lower circuit pattern.

A solder 150 may be disposed on the first and second electrode pads 131*a* and 133*a* and the mounting pad 115*a* which are exposed by the second insulation layer 140 to attach the heat generating device 200 to the radiant heat circuit board 100.

A lead solder or lead-free solder cream may be coated on the metal projection 115 and then the heat generating device 200 may be mounted to thermally treat the resultant, thereby forming the solder 150.

The heat generating device 200 may be a light emitting device such as a light emitting diode (LED). Each of the electrodes of the heat generating device 200 may be connected to the first and second electrode pads 131*a* and 133*a* to emit light.

As described above, in the radiant heat circuit board 100 for mounting the plurality of heat generating devices 200, the pad 115*a* for mounting the heat generating device 200 is manufactured using a top surface of the metal projection 115 connected to the metal plate 110, and also the metal projection 115 is integrally formed with respect to the plurality of heat generating devices 200. Thus, the heat radiation may be performed through the metal projection 115 between the heat generating devices 200 to improve the heat radiation.

Hereinafter, a heat generating device package according to a second embodiment will be described with reference to FIGS. 6 to 9.

Figure 6:
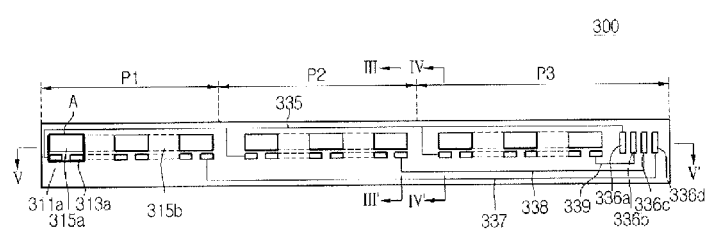
FIG. 6 is a sectional view of a radiant heat circuit board according to a second embodiment.
Figure 7:
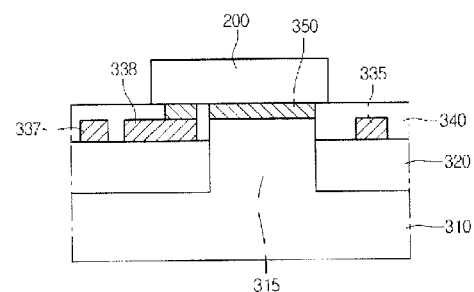
FIG. 7 is a sectional view taken along line III-III' in a heat generating device package to which the radiant heat circuit board of FIG. 6 is applied.
Figure 8:
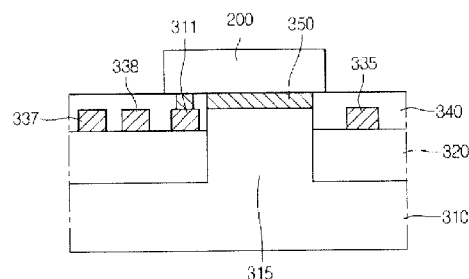
FIG. 8 is a sectional view taken along line IV-IV in the heat generating device package to which the radiant heat circuit board of FIG. 6 is applied.
Figure 9:
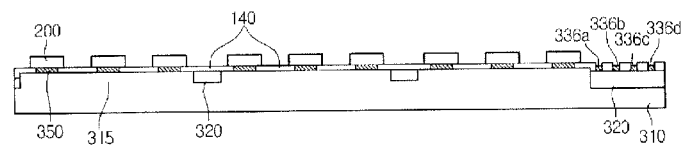
FIG. 9 is a sectional view taken along line V-V' in the heat generating device package to which the radiant heat circuit board of FIG. 6 is applied.

FIG. 6 is a sectional view of a radiant heat circuit board according to a second embodiment. FIG. 7 is a sectional view taken along line III-III' of a heat generating device package to which the radiant heat circuit board of FIG. 6 is applied. FIG. 8 is a sectional view taken along line IV-IV' of a heat generating device package to which the radiant heat circuit board of FIG. 6 is applied. FIG. 9 is a sectional view taken along line V-V' in the heat generating device package to which the radiant heat circuit board of FIG. 6 is applied.

Referring to FIGS. 6 to 9, a heat generating device package 300 according to the second embodiment is used in a heat generating device package to mount a plurality of heat generating devices 200. Descriptions about the same part as the first embodiment in a radiant heat circuit board 300 according to the second embodiment are omitted.

The radiant heat circuit board 300 includes mounting pads 215*a* arrayed in a line to mount the plurality of heat generating devices 200 arrayed in a line.

Although the bar-type radiant heat circuit board is illustrated in the current embodiment, the present disclosure is not limited thereto. When the plurality of heat generating devices 200 arrayed in a line are mounted on the radiant heat circuit board 300, the radiant heat circuit board 100 may include the plurality of mounting pads 315*a* arrayed in a line.

The radiant heat circuit board 300 includes a metal plate 310, insulation layers 320 and 340 disposed on the metal plate 310, and circuit patterns 311, 313, 314, 335, 337, 338, 339, 336*a*, 336*b*, 336*c*, and 336*d* disposed on the insulation layers 320 and 340.

The metal plate 310 includes a metal projection 315 constituting the mounting pad 315*a* for mounting the heat generating device 200.

The metal projection 315 extends from the metal plate 310 to vertically protrude. A portion of a top surface of the metal projection 315 may serve as the mounting pad 315*a* for mounting the heat generating device 200. Also, the metal projection 115 has a predetermined width so that a solder 350 is disposed on the top surface thereof.

The metal projection 315 may be integrally provided to simultaneously mount the plurality of heat generating devices 200 arrayed in one line.

That is, the metal projection 315 disposed under the heat generating device 200 and the metal projection 315 disposed under the adjacent heat generating device 200 are connected to each other. Thus, the metal projection 315 extends between the heat generating device 200 and the adjacent heat generating device 200.

As described above, since the metal projection 315 is integrally provided under the plurality of heat generating devices 200 arrayed in one line, the metal layer is disposed into an area between the heat generating devices 200 which is filled with an insulation layer 320 in a related art, thereby improving heat radiation.

The metal plate 310 may be etched or a plating or printing process may be performed on the metal plate 310 to manufacture the integrated metal projection 315.

As described above, the integrated metal projection 315 may be opened to form a first insulation layer 320.

A plurality of circuit patterns 311, 313, 314, 335, 337, 338, 339, 336*a*, 336*b*, 336*c*, and 336*d* are disposed on the first insulation layer 320.

The circuit patterns 311, 313, 314, 335, 337, 338, 339, 336*a*, 336*b*, 336*c*, and 336*d* include a plurality of power pads 336*a*, 336*b*, 336*c*, and 336*d*, a plurality of electrode pads 311, 313, and 314, and a plurality of circuit wires 335, 337, 338, and 339 connecting the power pads 336*a*, 336*b*, 336*c*, and 336*d* to the electrode pads 311, 313, and 314.

The power pads 336*a*, 336*b*, 336*c*, and 336*d* are disposed on an edge area of the circuit board 300. The power pads 336*a*, 336*b*, 336*c*, and 336*d* receive a voltage from the outside to provide the voltage into the electrode pads 311, 313, and 314 through the circuit wires 335, 337, 338, and 339.

The power pads 336a, 336b, 336c, and 336d are exposed by a second insulation layer 340 burying the circuit patterns 311, 313, 314, 335, 337, 338, 339, 336a, 336b, 336c, and 336d. The power pads 336a, 336b, 336c, and 336d include a first power pad 336 for receiving a positive voltage from the outside and second to fourth power pads 336b, 336c, and 336d for receiving a negative voltage.

Although three pads 336b, 336c, and 336d for receiving the negative voltage are provided in the current embodiment, the present invention is not limited thereto. For example, the number of power pads may be variously changed according to the number of heat generating devices 200 and a circuit design.

The radiant heat circuit board 300 may be divided into a plurality of division areas (first to third areas). The number of divided areas may be equal to that of the power pads 336b, 336c, and 336d for receiving the negative voltage.

Each of the division areas may include a plurality of heat generating device mounting areas A. As shown in FIG. 6, three mounting areas A may be disposed on one division area.

A mounting pad 315a, a first electrode pad 311 disposed on a side of the mounting pad 315a, and a second electrode pad 313 separated from the first electrode pad 311 are disposed on each of the mounting areas A.

Here, the second electrode pad 313 is connected to the first electrode pad 311 of the adjacent mounting area A through a connection part 314. The first one of the first electrode pads 311 in each of the division areas is connected to the first power pad 336a through the positive circuit wire 335 at the same time. Also, the last one of the second electrode pads 313 in each of the division areas is connected to the second to fourth power pads 336b, 336c, and 336d through the negative circuit wires 337, 338, and 339, respectively.

Thus, as shown in FIGS. 6 and 9, the second insulation layer 340 exposes the power pads 336a, 336b, 336c, and 336d and buries the circuit wires 335, 337, 338, and 339. Also, in each of the heat generating device mounting areas A, the second insulation layer 340 exposes the mounting pas 315a that is a top surface of the metal projection 315 and the first and second electrode wires 311 and 313.

The second insulation layer 340 may be formed of a solder resist to protect the lower circuit pattern.

A solder 350 may be disposed on the first and second electrode pads 311 and 313 and the mounting pad 315a which are exposed by the third insulation layer 340 to attach the heat generating device 200 to the radiant heat circuit board 300, thereby forming the heat generating device package.

The heat generating device 200 may be a light emitting diode.

As described above, in the radiant heat circuit board 300 for mounting the plurality of heat generating devices 200, the pad 315a for mounting the heat generating device 200 is manufactured using a top surface of the metal projection 315 connected to the metal plate 310, and also the metal projection 315 is integrally formed with respect to the plurality of heat generating devices 200. Thus, both electrode pads 311 and 313 may be disposed at a side of the metal projection 315 to minimize an area except the mounting area A of the heat generating device 200.

Hereinafter, a third embodiment will be described with reference to FIG. 10.

The radiant heat circuit board 400 according to the third embodiment includes mounting pads 415a arrayed in a line to mount the plurality of heat generating devices 200 arrayed in a line.

Although the circular-shaped radiant heat circuit board 400 is illustrated in the current embodiment, the present disclosure is not limited thereto. When the plurality of heat generating devices 200 arrayed in a line are mounted on the radiant heat circuit board 400, the radiant heat circuit board 400 may include the plurality of mounting pads 415a arrayed in a line.

Figure 10:
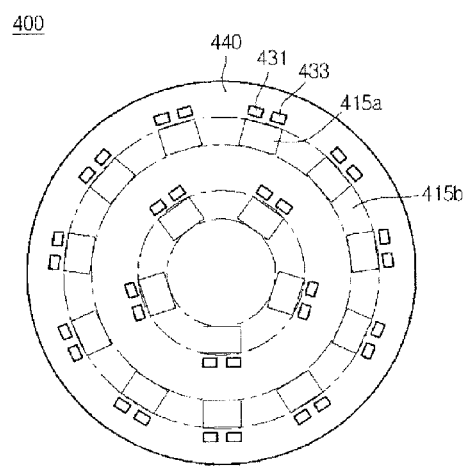
FIG. 10 is a sectional view of a radiant heat circuit board according to a third embodiment.

That is, as shown in FIG. 10, the circular-shaped radiant heat circuit board 400 may be arranged in a plurality of lines so that the plurality of mounting pads 415a have a concentric circle shape. The mounting pad 415a is opened by the topmost insulation layer 440 of the top surface of the metal projection protruding from the metal plate as shown in FIGS. 1 to 9. Here, since the metal projection is integrally formed corresponding to the plurality of heat generating devices 200, the metal projection may be provided also on an area 415b in which the heat generating device 200 is not mounted to improve the heat radiation.

Although the first and second electrode pads 431 and 433 are disposed at a side of the mounting pad 415a in FIG. 10, the present disclosure is not limited thereto. For example, the first and second electrode pads 431 and 433 may be disposed on both sides of the mounting pad 415a as shown in FIG. 1.

Hereinafter, a backlight unit including the heat generating device package of FIG. 2 will be described with reference to FIG. 11.

Figure 11:
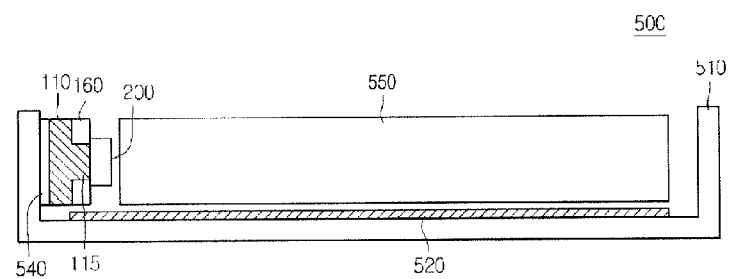
FIG. 11 is a sectional view of a backlight unit including the heat generating device package of FIG. 2.

Referring to FIG. 11, a backlight unit 500 according to an embodiment includes a bottom cover 510, a reflective layer 520 on the bottom cover 510, a light guide plate 550 on the reflective layer 520, and a heat generating device package attached to a side surface of the bottom cover 510.

The heat generating device package may be a light emitting device package including a light emitting device 200. A light emitting diode chip is mounted on the light emitting device package.

As described in FIGS. 2 to 10, the light emitting device package includes the light emitting device 200 to which the radiant heat circuit board is attached. Here, the light emitting device 200 emits light toward a side surface of the light guide plate 550.

The light emitting device package may physically adhere to a side surface of the bottom surface 510 through a radiant heat adhesion layer 540 and be fixed through a bracket.

The reflective layer 520 may extend up to a lower portion of the light guide plate 550 and a lower portion of light emitting device package to reflect light dispersed onto a bottom surface of the light guide plate 550, thereby emitting the light toward a top surface of the light guide plate 550.

The light guide plate 550 may be a surface light source which emits light incident from the side surface toward the top surface. Thus, the light guide plate 330 may uniformly emit light onto a display panel disposed on the top surface thereof.

The radiant heat circuit board may be used in the backlight unit to release heat generated from the light emitting device 200 to the outside through the bottom cover 510.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A radiant heat circuit board for mounting a plurality of heat generating devices, the radiant heat circuit board comprising:
   a metal plate comprising a metal projection to which the plurality of heat generating devices is attached;
   an insulation layer exposing the metal projection, the insulation layer being disposed on the metal plate; and
   a plurality of electrode pads disposed on the insulation layer, the plurality of electrode pads applying a voltage to each of the heat generating devices;
   wherein the plurality of heat generating devices is attached to the metal projection;
   wherein each of the plurality of electrode pads comprises:
   a first electrode pad disposed on one side of the metal projection and receiving a first voltage; and
   a second electrode pad separated from the first electrode pad, receiving a second voltage and disposed on the one side of the metal projection with the first electrode pad.

2. The radiant heat circuit board according to claim 1, wherein the metal projection comprises:
   a mounting pad with a portion of a top surface of the mounting pad exposed to mount the heat generating devices; and
   a connection part connecting the mounting pad to an adjacent mounting pad.

3. The radiant heat circuit board according to claim 2, wherein the first electrode pad and an adjacent first electrode pad are connected.

4. The radiant heat circuit board according to claim 2, wherein the metal projection comprises:
   a first region attached to a first heat generating device of the plurality of heat generating devices;
   a second region attached to a second heat generating device of the plurality of heat generating devices; and
   a third region between the first region and the second region, being exposed to an outside;
   wherein a top surface of the third region, a top surface of the first region, and a top surface of the second region are disposed on a same plane.

5. The radiant heat circuit board according to claim 2, wherein each second electrode pad connected to one heat generating device of the plurality of heat generating devices is connected to a first electrode pad connected to an adjacent heat generating device of the plurality of heat generating devices.

6. The radiant heat circuit board according to claim 1, wherein the metal projection has a bar shape.

7. The radiant heat circuit board according to claim 1, wherein the metal projection has a circular shape.

8. A heat generating device package comprising:
   a radiant heat circuit board comprising a plurality of integrated pads along which a plurality device mounting areas are defined, the integrated pads crossing the plurality of device mounting areas and being connected to each other; and
   a plurality of heat generating devices attached to the integrated pads which are exposed to the device mounting areas;
   wherein the radiant heat circuit board comprises:
   a metal plate comprising a metal projection on which one of the integrated pads is disposed;
   an insulation layer exposing the metal projection, the insulation layer being disposed on the metal plate; and
   a plurality of electrode pads disposed on the insulation layer, the plurality of electrode pads applying a voltage to each of the heat generating devices;
   wherein the plurality of heat generating devices is attached to the metal projection, and
   wherein the plurality of electrode pads comprises:
   a plurality of first electrode pads disposed on one side of the metal projection and receiving a first voltage; and
   a plurality of second electrode pads separated from the first electrode pad, receiving a second voltage and disposed on the one side of the metal projection with the first electrode pads.

9. The heat generating device package according to claim 8, wherein each of the heat generating devices is a light emitting diode.

10. The heat generating device package according to claim 8, wherein the metal projection comprises
    a first region attached to a first heat generating device of the plurality of heat generating devices;
    a second region attached to a second heat generating device of the plurality of heat generating devices; and
    a third region between the first region and the second region, and exposed to an outside;
    wherein a top surface of the third region, a top surface of the first region, and a top surface of the second region are disposed on a same plane.

11. The heat generating device package according to claim 8, wherein the radiant heat circuit board further comprises a solder resist exposing a top surface of the metal projection on the device mounting areas.

12. The heat generating device package according to claim 11, wherein one of the plurality of first electrode pads and an adjacent first electrode pad of the plurality of first electrode pads are connected to each other.

13. The heat generating device package according to claim 11,
    wherein one of the plurality of second electrode pads connected to one heat generating device is connected to one of the plurality of first electrode pads connected to an adjacent heat generating device.

14. A backlight unit comprising:
    a bottom cover;
    a light guide plate received by the bottom cover; and
    a light emitting module attached to a side surface of the bottom cover to emit light toward a side surface of the light guide plate,
    wherein the light emitting module comprises:
    a heat generating device package comprising: a plurality of light emitting devices;
    a metal plate comprising a metal projection to which the plurality of light emitting devices is attached, an insulation layer exposing the metal projection, the insulation layer being disposed on the metal plate, and a plurality of electrode pads disposed on the insulation layer, the plurality of electrode pads applying a voltage to the plurality of light emitting devices, respectively;
    wherein each of the electrode pads comprises a first electrode pad receiving a first voltage and a second electrode pad separated from the first electrode pad and receiving a second voltage,
    wherein the first electrode pad is disposed on one side of the metal projection with the second electrode pad, wherein each second electrode pad connected to one light emitting device is connected to one first electrode pad of an adjacent light emitting device, and wherein each second electrode pad mounted with one light emitting device is connected to a first electrode pad mounted with an adjacent light emitting device.

15. The backlight unit according to claim 14, wherein each of the light emitting devices is a light emitting diode.

* * * * *